US00RE46703E

(19) United States
(12) Reissued Patent
Tsironis

(10) Patent Number: US RE46,703 E
(45) Date of Reissued Patent: Feb. 6, 2018

(54) HIGH FREQUENCY, HIGH REFLECTION PRE-MATCHING TUNERS WITH VARIABLE ZERO INITIALIZATION

(71) Applicant: Christos Tsironis, Kirkland (CA)

(72) Inventor: Christos Tsironis, Kirkland (CA)

(21) Appl. No.: 14/066,729

(22) Filed: Oct. 30, 2013

Related U.S. Patent Documents

Reissue of:
(64) Patent No.: 7,034,629
Issued: Apr. 25, 2006
Appl. No.: 10/331,478
Filed: Dec. 31, 2002

U.S. Applications:
(60) Provisional application No. 60/343,241, filed on Dec. 31, 2001.

(51) Int. Cl.
*H03H 7/38* (2006.01)
*G01R 27/00* (2006.01)

(52) U.S. Cl.
CPC ..... *H03H 7/38* (2013.01); *G01R 27/00* (2013.01)

(58) Field of Classification Search
CPC ..... H03H 7/38; G01R 27/00
USPC ..... 333/263, 17.3; 324/76.49, 76.11, 76.51, 324/642
See application file for complete search history.

(56) References Cited

U.S. PATENT DOCUMENTS 4,535,307 A * 8/1985 Tsukii ..... 333/35
6,515,465 B2 * 2/2003 Kiyokawa et al. ..... 324/76.49
6,664,868 B1 * 12/2003 Echols, Jr. ..... 333/33
6,674,293 B1 * 1/2004 Tsironis ..... H01P 5/04 324/637

OTHER PUBLICATIONS

Focus Microwaves, "Computer Controlled Microwave Tuner—CCMT", Product Note 41, Jan. 1998.*

* cited by examiner

*Primary Examiner* — My-Trang Ton

(57) ABSTRACT

Automatic microwave pre-matching tuners with new zero positioning capability allowing for a minimum idle airline section between pre-matching and tuning section, thus minimizing insertion loss and enhancing high reflection tuning capability at high frequencies and tuner calibration algorithm of the pre-matching section over one half of a wavelength and of the tuning section over one full wavelength at each operation frequency and associated tuning and measurement operation algorithms.

2 Claims, 5 Drawing Sheets

Pre-matching tuner with variable zero position and frequency dependent pre-matching and tuning sections, front view

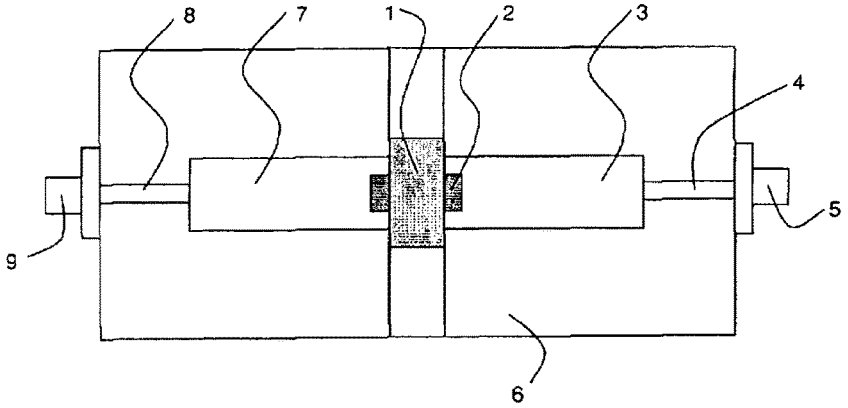
FIG. 1: Prior Art: Transforming networks on DUT test fixture
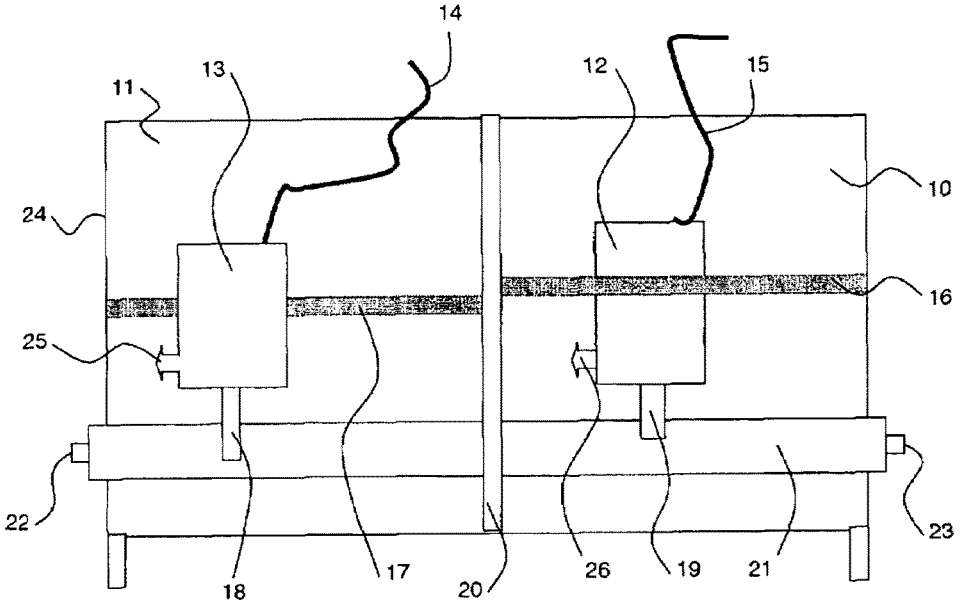
FIG. 2: Prior Art: Pre-matching tuner structure

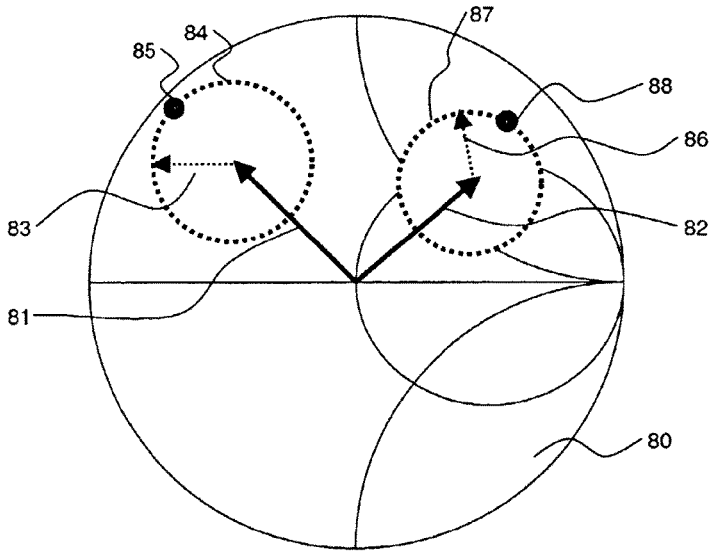
FIG. 3: Prior Art: Tuning mechanism of traditional pre-matching tuners with fixed pre-matching and tuning sections
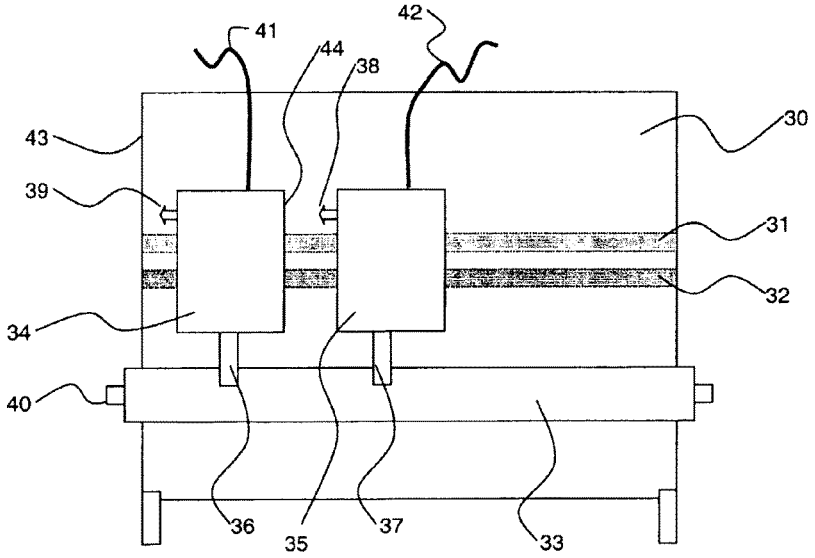
FIG. 4: Pre-matching tuner with variable zero position and frequency dependent pre-matching and tuning sections, front view

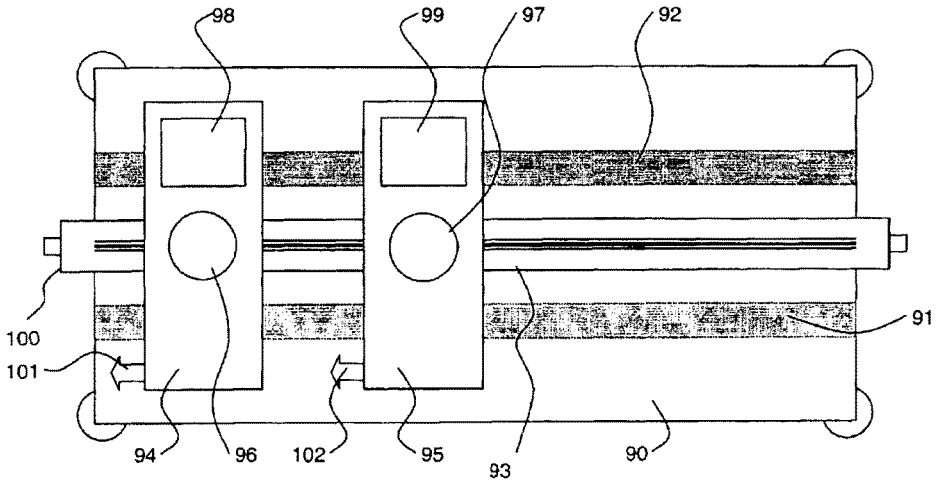
FIG. 5: Pre-matching tuner with variable zero position and frequency dependent pre-matching and tuning sections, top view
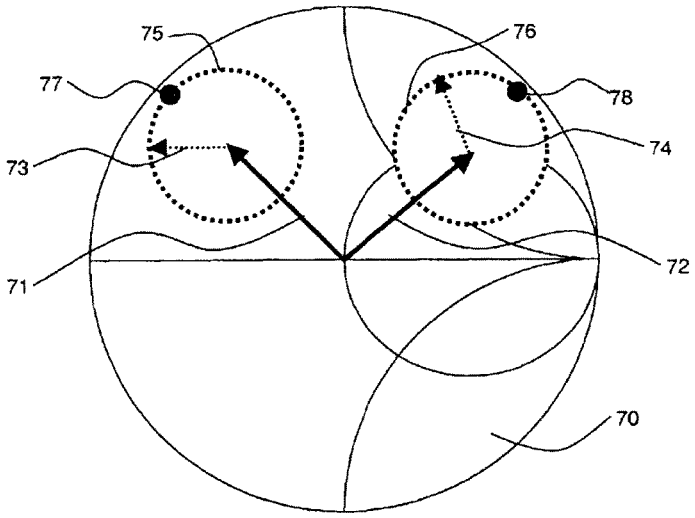
FIG. 6: Tuning mechanism of pre-matching tuners with variable zero position and frequency dependent pre-matching and tuning sections

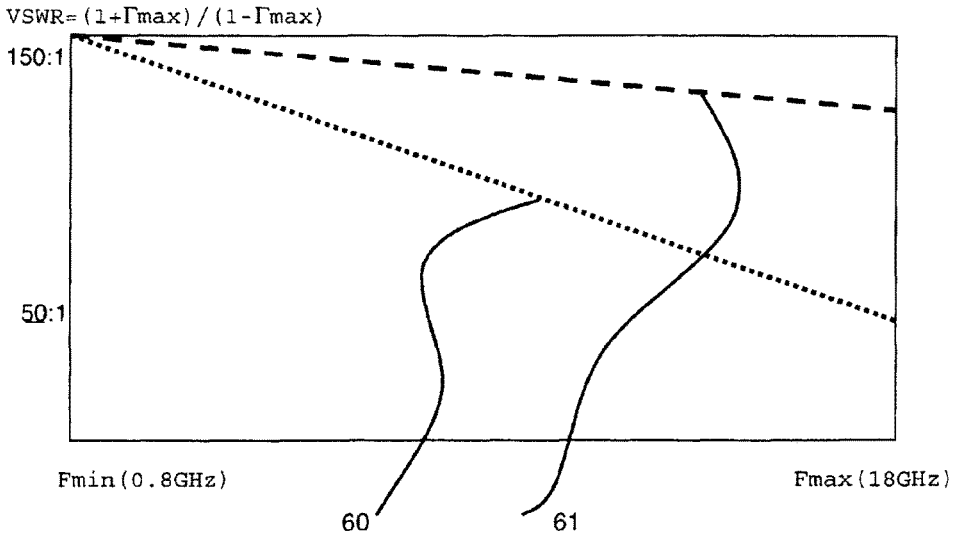
FIG 7: Improvement in Maximum Reflection factor of a new variable zero pre-matching tuner (61) compared to a fixed zero tuner (60, prior art).

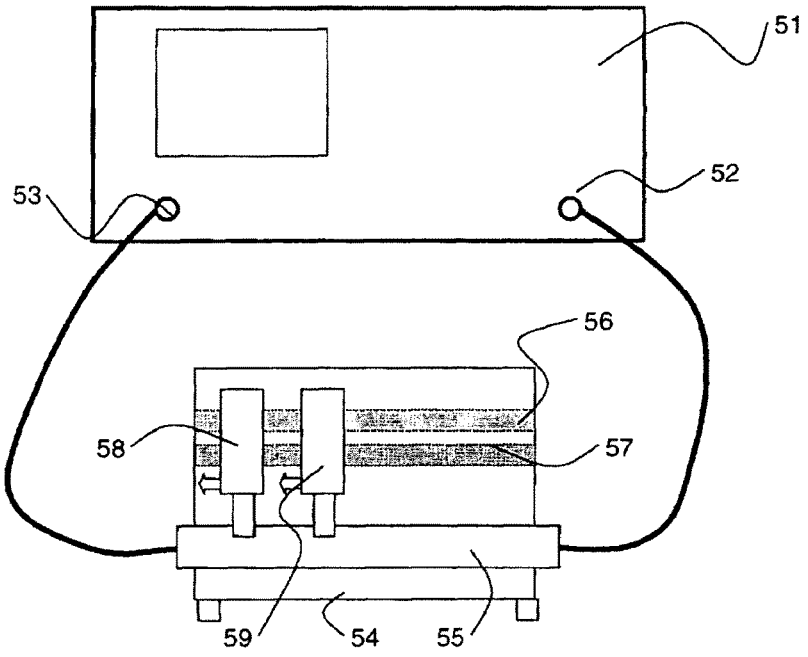
FIG. 8: Pre-matching tuner calibration set-up (partly prior)

HIGH FREQUENCY, HIGH REFLECTION PRE-MATCHING TUNERS WITH VARIABLE ZERO INITIALIZATION

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY CLAIM

This application claims benefit of priority of U.S. Provisional Application Ser. No. 60/343,241 filed on Dec. 31st, 2001 entitled High Frequency, High Reflection Pre-matching Tuners with Variable Zero Initialization, whose inventor was Christos TSIRONIS.

CROSS REFERENCE TO RELATED APPLICATIONS

Not Applicable

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

1. Field of the Invention

This invention describes a new solution for obtaining user controlled high reflection factors using wideband pre-matching microwave tuners.

2. Description of the Prior Art

High reflection factors are obtained actually using either permanent pre-matching networks on the RF circuits or test fixtures themselves (FIG. 1) or/and pre-matching tuners (FIG. 2). In more detail, the problem of high reflection factor microwave tuning, required for Load Pull and Noise testing of high power and low noise transistors, using automatic or manual microwave tuners, has been addressed up to date in different manners as follows:

1. Using (Pre-matching) Transforming Networks (FIG. 1)

These transforming networks (3, 7) are manufactured on the test fixtures (6) or 'on-chip' meaning as integral part of the semiconductor circuit (monolithic integrated circuit). This allows a static pre-matching, in which the characteristic impedance of the test system (typically 50 Ohm) is transformed to values, which lie closer to the conjugate complex of the internal impedance of the DUT (device under test) (1). This technique makes further tuning by external controllable automatic or manual tuners, connected to the ports (5, 9) of the test fixture (6) easier and more accurate.

This static pre-matching technique has been used for long time in RF technology, but has the disadvantage of not being able to cover a significant frequency bandwidth or match a variety of DUT's (1) using the same transforming networks (3, 7), which said networks must be re-designed and manufactured for every other test frequency and DUT.

2. Using Pre-matching Tuners (FIG. 2)

Pre-matching tuners consist of a housing (10), a slotted airline or slabline (21), and two mobile carriages (12,13), which are driven by two lateral mechanisms such as driving screws (17) and (16), which themselves are controlled by stepping motors via electrical signals (14,15). Each carriage has a vertical axis, which can insert or withdraw RF probes (slugs) (18, 19) into the slotted airline (21) again driven by electrical stepper motors.

These devices have the capability of generating very high reflection factors using the two (or more) RF slugs (18,19) in series and positioning them in such a manner that a first RF slug (pre-matching slug, 18) is positioned inside the airline (21) such as to generate a reflection factor (81, FIG. 3) close to the conjugate complex of the DUT's internal impedance. Then the second RF slug (tuning slug, 19) can tune easier and more accurately around the DUT's conjugate complex internal impedance (85), on a circle (84).

The theory and the experimental behavior behind this approach is basically the same as in case 1, i.e. transforming the characteristic impedance of the test system close to the conjugate complex internal impedance of the DUT before proceeding to the actual tuning. In comparison to case 1, this second method has the advantage of being adjustable i.e. by adjusting the position and depth of the first RF slug (18), we can determine the actual amplitude and angle of the peak of the pre-matching vector (81 or 82) to be close to the conjugate complex internal impedance of the DUT on the Smith Chart (80), and to be adjustable to match the internal impedance of various DUT's at various frequencies and other test conditions, without having to re-design the pre-matching networks, as is the case when using the technique of case 1 (FIG. 1). The second RF slug (tuning slug) can then be adjusted to reach maximum values (85, 88) to match even very high reflection DUT's.

Pre-matching tuners designed as shown in FIG. 2, i.e., incorporating two fully independent tuning sections (16,17) with associated tuner carriages (12,13) and RF slugs (19,18) have a serious disadvantage at higher frequencies, starting in fact around 5-6 GHz. The disadvantage is that the airline section between the position of the pre-matching slug (18) and the tuning slug (19) cannot be shorter than one half of the total length of the tuner itself (10), or one half of a wavelength at the lowest frequency of operation of the tuner, thus causing unnecessary insertion loss between the pre-matching and the tuning section, which reduces significantly the high reflection tuning capability of these pre-matching tuners, especially at higher frequencies. This minimum distance of one half of a wavelength ($\lambda/2$) at the minimum frequency of operation is necessary in order to allow a full 360° independent rotation of each of the pre-matching and tuning reflection vectors.

This fundamental characteristic of existing pre-matching tuners is due to basic design and mechanical restrictions related to the way those tuners operate, i.e. the fact that they require a permanent mechanical zero position as a fixed reference starting point for both the pre-matching as well as the tuning section of the tuner. Since tuners of this kind cover typically a wide frequency range of more than a decade (Max Frequency/Min Frequency>10), the electrical length of the idle and unused transmission line section between pre-matching and tuning RF sections corresponds to one half of a wavelength ($\lambda/2$) at the minimum frequency but to more than ten wavelength halves (or five full wavelengths) at the maximum frequency.

It is well known that insertion loss in transmission lines and in general in electromagnetic wave transmission is proportional to the total electrical length of the transmission section, amounting to a number of "Decibel (dB) per wavelength" at any given frequency. In other words, the insertion loss of a transmission line as used in RF tuners increases typically at least linearly, or more, with frequency.

The fixed minimum distance between the RF slugs leaves a section of transmission airline unused, who's relative length multiples of a wavelength ($n*\lambda$) increases as the frequency of operation increases (and the corresponding wavelength $\lambda$ [mm]=300/frequency[GHz]), since at higher frequencies only a small part of the pre-matching section is used. This unused section of transmission airline contributes insertion loss between the first (pre-matching) section and the second (tuning) section of the pre-matching tuner. The effect of this insertion loss is such that it effectively jeopardizes the high reflection, otherwise possible, from this tuner structure at frequencies higher than the minimum frequency of operation of the tuner; this negative impact on the high reflection factor tuning capability of pre-matching tuners is even more predominant at very high frequencies and worsens as the frequency of operation increases, obviously because the number of idle wavelengths of the transmission line between pre-matching and tuning sections increases.

The tuning mechanism of a traditional pre-matching tuner made according to prior art is shown in FIG. 3. Tuning at lower frequencies (below 5-6 GHz) is represented with reflection vectors (81) and (83) on a circle (84). Tuning at higher frequencies, like 12 GHz to 40 GHz is shown in FIG. 3 with reflection vectors (82) and (86) on circle (87). Because of higher losses in the tuner connectors (22, FIG. 2) the pre-matching vector (82) is slightly smaller than the pre-matching vector (81). However the tuning vector (86) at high frequencies is considerably smaller than the tuning vector (81) at lower frequencies, with the final effect that the maximum reflection factor obtained at low frequencies (85) to be sensibly larger that the maximum reflection vector (88) at higher frequencies.

This is a considerable limitation for high frequency applications of automatic pre-matching tuners. In the presently used structures of automatic pre-matching tuners a solid separation in form of a physical wall or other fixed obstacle (20) between the tuning and the pre-matching section is inherently necessary in order to establish a fixed zero position for the tuning section and is used as starting point for tuner calibration and operation.

In conclusion, the idle unused transmission line length between the pre-matching and the tuning RF sections prevents existing pre-matching tuners from realizing their full potential in highest reflection factor, because the tuning vector overlapping with the pre-matching vector, is attenuated by the insertion loss of this idle transmission line section.

BRIEF SUMMARY OF THE INVENTION

This invention describes a new solution for obtaining user controlled high reflection factors using wideband pre-matching tuners.

In order to avoid the shortcomings of the traditional pre-matching tuner approach as described in background to the invention, we propose a new tuner structure and operation which uses two RF slugs in a structure similar to traditional pre-matching tuners but with no physical separation between the pre-matching and the tuning sections.

The difference between the new proposed structure and all other existing tuner structures consists in the way the tuner is designed and manufactured in respect to its initialization mechanism (returning to the fixed zero position) and by consequence in the way the tuner is calibrated and operated.

The new tuner structure does not use a fixed mechanical zero position for the tuning part of the tuner (30, FIG. 4). The tuning carriage (37) uses the wall of pre-matching carriage (34) as zero limit position when it reaches the limit at point (44), when this carriage (34) is at its own mechanical zero reference position (43), which zero reference position is detected by a mechanical or optical switch (39, 38) against a fixed (43) or variable (44) limit.

This new structure allows keeping the effective distance and by consequence the insertion loss between the pre-matching and the tuning RF slug to a minimum, since there will be no idle transmission airline (33) between the pre-matching (36) and tuning (37) RF slugs. A appropriate tuner initialization routine and tuner calibration procedure is required, in order to operate this new tuner structure, which uses a mobile zero reference plane.

This new structure allows the pre-matching tuners to develop their full reflection factor tuning range potential independently on the frequency of operation.

BRIEF DESCRIPTION OF THE SEVERAL VIEWS OF THE DRAWING

The invention and its mode of operation will be more clearly understood from the following detailed description when read with the appended drawing in which:

FIG. 1 depicts a perspective view of the Prior Art showing typical quarter lambda impedance transforming networks on DUT test fixture.

FIG. 2 depicts a perspective view of the Prior Art showing a pre-matching tuner structure with a solid fixed separation between pre-matching and tuning section.

FIG. 3 depicts a perspective view of the Prior Art showing schematics of the tuning mechanism of traditional pre-matching tuners with fixed size pre-matching and tuning sections.

FIG. 4 depicts a front view of a Pre-matching tuner with variable zero position and frequency dependent pre-matching and tuning sections.

FIG. 5 depicts a birds eye view/top view of a Pre-matching tuner with variable zero position and frequency dependant pre-matching and tuning sections.

FIG. 6 depicts a perspective schematic view of the tuning mechanism of pre-matching tuners with variable zero positioning and frequency dependant pre-matching and tuning sections.

FIG. 7 depicts a graph illustrating the improvement in Maximum Reflection factor of a new variable zero pre-matching tuner (61) compared to a fixed zero pre-matching tuner (60, prior art).

FIG. 8 depicts a perspective view of a pre-matching tuner calibration set-up (partly prior art).

DETAILED DESCRIPTION OF THE INVENTION

This invention is described in the following paragraphs with reference to the FIGS. in which like numbers represent the same or similar elements.

We propose controllable microwave tuners, which include two or more RF slugs; connected in series in the same airline (or slabline for practical applications), (FIGS. 4, 5). The new tuners include a tuner body (30, 90), a slotted airline or slabline (33, 93) with RF connectors (40,100), two mobile carriages (34, 35) or (94, 95) which carry motors (98, 99) and vertical axis (96, 97) on which ends are fixed RF slugs (36, 37). Each carriage id driven by a lateral driving means, such as a screw, where carriage (34) is driven by screw (32), and carriage (35) is driven by screw (31), or (94) by (91) and (95) by (92). Each carriage includes a proximity switch (39), (38) or (101), (102).

In their operation the new tuners (FIGS. 4, 5) differ from existing pre-matching tuners (FIG. 2) in the following aspects:

1. The new tuners do not have a fixed separation if form of a wall (20, FIG. 2) or other fixed obstacle, between the pre-matching section (17) and the tuning section (18), by consequence;

2. The zero position of the tuning section of the new tuners is not at a fixed distance (17) from the DUT-close tuner wall (24), but a mobile one as shown by carriage (35) in FIG. 4. This said zero position of the tuning carriage (35) is the carriage (34) of the pre-matching section, when this is at its furthest left position closest to the device under test.

3. The new tuners (FIGS. 4 and 5) include two parallel carriage control screws (31) and (32) running through the entire tuner body (30) instead of two control screws (16) and (17) in FIG. 2, which stop at the center of the tuner body (10) and do not extend beyond the central wall (20), which said central wall (20) serves as permanent zero position reference for the tuning section carriage (12, 16).

The new proposed arrangement (FIG. 4), however, allows the tuning carriage to operate as close to the DUT-near connector (40) of the tuner as possible, for any given frequency, because it initializes (returns to mechanical zero) against the pre-matching carriage (34), thus not including any unnecessary insertion loss between the pre-matching (34) and the tuning (35) carriages. The direct consequence of this new arrangement is shown in the reflection factor tuning mechanism of FIG. 6. In this case the tuning reflection factor vector at high frequencies (74) has practically the same amplitude as the reflection factor vector (73) at lower frequencies. This results to a maximum reflection factor (78), which is very similar in amplitude as the maximum reflection factor at lower frequencies (77). The remaining difference between the two tuning vectors at both frequencies lies in the insertion loss of the common RF connector (40), which is naturally higher at higher frequencies. However this new arrangement allows a sensible increase in reflection factor amplitude between the existing pre-matching tuners (as in FIG. 2.) and the new pre-matching tuners of FIG. 4 especially at high frequencies, where the insertion loss of the airline section between the pre-matching and the tuning section becomes relevant in reducing the amplitude of the tuning vector (86) in FIG. 6.

The difficulty of this new proposed configuration consists in defining and using a workable and reliable technique for initializing (or defining the mechanical zero position reference) of the tuning carriage (35).

In our proposed configuration, the required zero position reference for the tuning carriage (35) is the furthest position of the pre-matching carriage (34). In order to make this work, we introduce a new tuner initialization algorithm, which has never been used in tuners up to now.

This new algorithm is described and compared to the existing tuner initialization algorithms:

1. Prior Art: Existing Initialization Algorithms (FIG. 2)

a. Move the pre-matching carriage (13) towards the left mechanical tuner wall (24) until the proximity switch (25), which may be electro-mechanical, magnetic, electrical or optical, responds. This is defined as the pre-matching "zero" reference position.

b. Move the tuning carriage (12) towards the central tuner wall (20) until the proximity switch (26) responds. This is defined as the tuning "zero" reference position.

2. New Procedure (FIG. 4)

a. Move pre-matching carriage (34) towards the left tuner wall (43) until the proximity switch (39) responds.

b. Move tuning carriage (35) towards the standing pre-matching carriage (34) until the proximity switch (38) responds when it touches the pre-matching carriage (34) at the point (44). This is defined as the tuning "zero" reference position.

After this procedure both tuner carriages (34) and (35) are said to have reached their initialization status. Compared with prior art, the tuning carriage (35) holds a different "zero" reference position, which is as close to the DUT test port (40) of the tuner as possible, in order to allow the pre-matching carriage (34) to move towards the right side of the tuner (30) in order to cover at least 360° phase tuning range as required for a full tuner operation. This way only one half of a wavelength separates the pre-matching (34) from the tuning (35) section of the tuner in the worst case, and not up to ten or more wavelengths, as in prior art (FIG. 2). Ten or more wavelengths are included by the fact that common pre-matching tuners are typically required and offered for frequency operation from 0.8 GHz to 18 GHz; the ratio of wavelengths being 18/0.8=22.5, and an idle airline length of 22.5/2=11.25 wavelengths plus the thickness of the separating wall (20) in FIG. 2, are in fact interjected between pre-matching and tuning section at the highest frequency of 18 GHz, adding, unnecessarily, insertion loss between the pre-matching and tuning sections of a traditional pre-matching tuner and limiting the high reflection factor tuning capability of the tuner.

In this context it is important to emphasize that it is not the existence of a physical separation wall (20) between pre-matching and tuning sections of a pre-matching tuner, which is significant. What is significant is the position at which the reference plane for initializing the tuning section is placed. The initialization mechanism may be a physical wall, or it may be a physical obstacle in order to trigger the proximity switch, which said obstacle does not have the form of a physical wall separating the tuner in two obvious mechanical sections, but in fact it divides the tuner in two permanent operational sections. The important issue here is that in traditional pre-matching tuners as described in "prior art" the two tuning sections have "fixed lengths", independently on the frequency of operation, which said fixed lengths correspond to one half of a wavelength at the lowest specified frequency of operation, plus the thickness of the separating wall plus the width of one carriage (12) or (13).

The new pre-matching tuner we propose (FIG. 4 in side view and FIG. 5 in top view) does not have fixed lengths for any of both its tuning sections; on the contrary the lengths of said new tuner's tuning sections are varying with the frequency and are always kept to the minimum of one half of a wavelength at the actual frequency of operation thus minimizing the insertion loss and by consequence maximizing the reflection factor amplitude tuning range. The direct consequence of this configuration and operation is an improvement in maximum reflection factor obtainable with the new tuner as shown in FIG. 7. Trace (60) is the typical maximum reflection factor of a traditional pre-matching tuner (prior art) over a frequency range 0.8 to 18 GHz. Trace (61) is the typical maximum reflection factor of a pre-matching tuner with variable zero as described in this patent. The vertical axis scale is in VSWR (=Voltage Standing Wave Ratio), which can be calculated from the reflection factor, Γmax as VSWR=(1+Γmax)/(1−Γmax). This measure is preferred in high reflection tuners, because it has higher resolution at high reflection factors. Higher frequency pre-matching tuners, like 4-40 GHz behave in a similar manner.

3. Calibration Procedure

The new pre-matching tuners require also a different calibration procedure that is described here. The setup is the same as in prior art (FIG. 8). The procedure for calibration is different than in prior art in what concerns the initialization of the tuner sections, the format of the data saved and the horizontal travel distance of the secondary carriage (59 FIG. 8):

The tuner (54) is calibrated on a Vector Network Analyzer (VNA) (51) as follows:

a. Calibration of the Pre-matching Section (58):

The tuning section of the pre-matching tuner is deactivated, meaning: the RF slug is withdrawn completely and the tuning carriage (59) is moved away from the pre-matching carriage (58) by at least one wavelength, at the operating frequency.

In a closed logical software loop then, and starting at the center of the Smith Chart a set of reflection factor target values is defined, like 0.1, 0.2, 0.3 . . . 0.9; the RF slug of the pre-matching section is inserted into the airline (55) by a certain number of steps; the reflection factor is measured by the VNA (51) at its port 1 (53) via a flexible RF cable and corrected to the tuner's reference plane and compared with the target value.

The vertical motor is then moved by a number of steps proportional to the difference between target value and measured value of the tuner reflection factor and inserts the RF slug further into the slabline in order to increase the reflection factor; the vertical movement stops when the expected value of reflection factor is reached, within a small measurement tolerance, and a reflection factor measurement is taken. This is an efficient iterative process that delivers accurate vertical positioning of the RF slugs into the slabline (55), in order to obtain certain reflection factors.

Once all vertical positions for a given number of vertical reflection factor values have been determined, these values are saved in memory and the tuner is successively positioned and moved horizontally in a manner as to cover 360° on the Smith Chart (covering a total distance of half a wavelength or λ/2) and generating a set of calibration points. At each said tuner position the S-parameters of the tuner twoport are measured on the Vector Network Analyzer (51) and saved in a re-useable data file in form of a matrix on the computer's hard disk with following format:

{Xpos.i, Ypos.i, S11.i, S12.i, S21.i, S22.i }, where Smn are complex S-parameters in real/imaginary format, {m,n}={1,2} and the index "i" varies between 1 and 200, 400 or 800, depending on the user's calibration density preference.

Higher calibration densities are possible, but time consuming, and, because of numerical interpolation techniques that can be used, do not necessarily enhance neither the tuning operation nor the accuracy of the system.

In addition to the S-parameter data of the pre-matching section the maximum horizontal distance of the pre-matching section from the zero position Xpos1 .Max is also saved in the tuner calibration file, which corresponds to one half of a wavelength at the selected frequency (λ/2).

b. Calibration of the Tuning Section (59):

The pre-matching carriage (58) is initialized, its RF slug is completely withdrawn from the airline and it is moved to the zero position closest to the DUT.

The tuning carriage (59) is initialized against the standing pre-matching carriage (58).

In a closed logical software loop then, and starting at the center of the Smith Chart a procedure identical to paragraph a.) Is carried through; however this second calibration cycle moves the secondary (or tuning) carriage (59) horizontally over a full wavelength (λ) at the selected frequency, instead of a half of a wavelength (λ/2) as in the primary calibration cycle a.); this way the reflection factor of the calibration points covers full two turns on the Smith chart; the calibration data of the tuning section (59) are then saved as an extension to the calibration data of the first part stemming from the calibration data of the pre-matching section (58).

The tuner calibration procedure is continuing by changing the frequency, recalculating the corresponding wavelengths, initializing the tuner as described above and proceeding with steps a. and b. of the calibration routine.

The tuner calibration data can be retrieved by the tuner control software and used to reproduce the tuner's impedances as a function of {Xpos, Ypos} positions, where Xpos and Ypos are the number of motor steps of the stepping motors controlling the tuner's movements, required to move the tuner carriage horizontally (Xpos) and the RF slug vertically (Ypos). For better understanding we are using here forth the expressions Xpos1, Ypos1 the positions of the primary (or pre-matching) carriage and Xpos2, Ypos2 the positions of the secondary (or tuning) carriage. The tuner calibration data of the tuning section (59) are used as follows: The secondary carriage (35, FIG. 4) is placed at a distance Xpos2 further away than the maximum travel of the primary carriage Xpos1 .Max (34, FIG. 4) as saved in the calibration file; then the position of the primary carriage Xpos1 is determined by the tuning algorithm which converts requested impedance values into tuner positions, using calibration data, which is a position between zero and one half of a wavelength, and the primary carriage is positioned accordingly; then the secondary carriage's (35) horizontal position Xpos2 is calculated using the same tuning algorithm and, if the secondary position Xpos2 is larger than the primary position Xpos1 then it is accepted, or, if it is smaller then a new position is calculated as equal to the originally calculated position plus one half of a wavelength, Xpos2'=Xpos2+λ/2, and the secondary carriage is moved to this position Xpos2'.

Although the present invention has been explained hereinabove by way of a preferred embodiment thereof, it should be pointed out that any modifications to this preferred embodiment within the scope of the appended claims is not deemed to alter or change the nature and scope of the present invention.

What I claim as my invention is:

[1. An automatic RF impedance tuner comprising an input port and an output port, a slotted airline connecting both ports, means of remotely positioning two independent mobile carriages carrying a wideband RF probe each, said probes being a primary, or pre-matching probe and a secondary, or tuning probe, said probes can be inserted into the slot and moved parallel to the axis of the airline and can be precisely positioned in such a manner as to generate adjustable microwave reflection factors, and whereas said secondary probe has means for a variable and frequency dependent initial horizontal position relative to the initial position of the primary probe.]

[2. A method for initializing horizontally the RF probes of the tuner as in claim 1, where the zero position of the primary probe is at a position closest to the tuner test port, adjacent to the device under test, and the zero position of the secondary probe is at a position adjacent to the primary probe, when said primary probe is at its initial (or zero) position, both zero positions being frequency independent.]

[3. A method for initializing horizontally the RF probes of the tuner where the zero position of the primary probe is at a position as in claim 2 and the zero position of the secondary probe is at a frequency dependent position adjacent to the far end of the carriage of the primary probe, when the primary carriage is at one half of a wavelength away from its initial (zero) position, at the operating frequency.]

*4. A method for initializing and calibrating automated RF impedance tuner,*

*said tuner comprising a test port, an idle port and a slotted airline (slabline) between the ports and two independent remotely controlled mobile carriages sliding along the slabline, carriage 1 closest to the test port and carriage 2 closest to the idle port,*

*said tuner having frequency dependent initial horizontal position,*

*each said carriage having a vertical axis carrying a wideband RF tuning probe, the carriage 1 carrying probe 1 (pre-matching probe) and the carriage 2 carrying probe 2 (tuning probe);*

*said probes being remotely insertable into the slabline at adjustable distance from the center conductor of the slabline and moving parallel to the axis of the airline;*

*whereby the probe 2 has variable and frequency dependent initial horizontal position relative to the initial position of the probe 1;*

*whereby each carriage comprises at least one horizontal limit (zero positioning) switch, and whereby frequency independent zero position occurs when the switch of the carriage 1 hits the tuner wall and the switch of the carriage 2 hits the wall of the carriage 1;*

*said method comprising the following steps:*

*a) attaching the tuner to a pre-calibrated vector network analyzer (VNA);*

*b) initializing (placing to zero position closest to the test port) the carriage 1 and withdrawing the probe 1 from the slabline;*

*c) moving the carriage 2 at least one wavelength at a test frequency away from the carriage 1 towards the idle port and withdrawing the probe 2 from the slabline;*

*d) inserting the probe 1 into the slabline progressively, measuring the reflection factor (S11) at the test port with the VNA and saving vertical positions at incremental S11 steps of approximately 0.1, up to S11 approximately 0.9;*

*e) moving the probe 1 to the vertical positions determined in step d) and, for each vertical position of probe 1, moving the carriage 1 in a multitude of steps from zero to half a wavelength ($\lambda/2$) at the test frequency, measuring a four s-parameters of the tuner and saving;*

*f) initializing the carriage 1 and withdrawing the probe 1 from the slabline;*

*g) initializing the carriage 2 (placing to zero position closest to the carriage 1);*

*h) repeating step d) for the probe 2;*

*i) moving the probe 2 to the values determined in step h) and, for each vertical position of the probe 2, moving the carriage 2 in a multitude of steps from zero to full wavelength ($\lambda$) at the test frequency, measuring the four s-parameters of the tuner and saving.*

*5. A tuning (impedance synthesis) method for RF impedance tuner, calibrated as in claim 4, comprising the following steps:*

*a) loading calibration data into computer memory;*

*b) defining a requested impedance;*

*c) calculating horizontal positions for probe 1 (X1) and probe 2 (X2) as required to generate the requested impedance;*

*d) if ($X2 \leq X1$) replacing X2 by ($X2+\lambda/2$);*

*e) calculating vertical positions for probe 1 (Y1) and probe 2 (Y2), as required to generate the requested impedance;*

*f) moving the probe 1 to (X1,Y1) and the probe 2 to (X2,Y2).*

* * * * *